United States Patent
Matsumoto et al.

(10) Patent No.: US 6,876,555 B2
(45) Date of Patent: Apr. 5, 2005

(54) SURFACE-MOUNT TYPE SWITCHING POWER-SUPPLY UNIT AND MOUNTING METHOD FOR THE SAME

(75) Inventors: Tadehiko Matsumoto, Yokohama (JP); Takayoshi Nishiyama, Yokohama (JP); Jun Nagai, Sagamihara (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/208,944

(22) Filed: Aug. 1, 2002

(65) Prior Publication Data

US 2002/0189083 A1 Dec. 19, 2002

Related U.S. Application Data

(62) Division of application No. 09/829,172, filed on Apr. 9, 2001, now abandoned.

(30) Foreign Application Priority Data

Apr. 12, 2000 (JP) ........................................ 2000-110632
Jan. 30, 2001 (JP) ........................................ 2001-021833

(51) Int. Cl.⁷ ............................................... H05K 7/06
(52) U.S. Cl. ..................... 361/782; 361/781; 29/743; 29/832; 336/200
(58) Field of Search ................................. 361/760, 781, 361/782, 811, 836; 336/200, 205, 232; 29/832, 739, 740, 741, 743

(56) References Cited

U.S. PATENT DOCUMENTS

| | | | |
|---|---|---|---|
| 5,726,612 A | * 3/1998 | Mandai et al. | 333/184 |
| 6,005,773 A | 12/1999 | Rozman et al. | |
| 6,069,548 A | * 5/2000 | Baarman et al. | 336/65 |
| 6,073,339 A | * 6/2000 | Levin | 29/606 |
| 6,442,832 B1 | * 9/2002 | Noble | 29/854 |
| 6,466,454 B1 | * 10/2002 | Jitaru | 361/836 |
| 6,696,909 B2 | * 2/2004 | Inoue et al. | 336/200 |

FOREIGN PATENT DOCUMENTS

| | | |
|---|---|---|
| JP | 63-54706 | 3/1988 |
| JP | 5-235261 | 9/1993 |
| JP | 7-38262 | 2/1995 |
| JP | 7-115025 | 5/1995 |
| JP | 7-192934 A | 7/1995 |
| JP | 10-326715 A | 12/1998 |
| JP | 11-40425 | 2/1999 |
| JP | 11-176648 | 7/1999 |
| JP | 11-233351 A | 8/1999 |
| JP | 2000-058336 A | 2/2000 |
| JP | 2000-91138 | 3/2000 |
| JP | 2000-078841 A | 3/2000 |

OTHER PUBLICATIONS

Product Catalog of (Japan) Lucent Technologies, Inc.; http://www.lucent.co.jp/power/.
Product Catalog of Tokin Corporation, vol. 02; Dec. 1992; pp. 84–91.

* cited by examiner

Primary Examiner—John B. Vigushin
(74) Attorney, Agent, or Firm—Keating & Bennett, LLP

(57) ABSTRACT

A transformer of a switching power-supply circuit is placed and mounted nearly in the middle area of a circuit board. The transformer is of a low-profile type, and a broad and flat upper surface of the transformer functions as a suction surface for a suction nozzle. When a surface-mount type switching power-supply unit is mounted in a mother board, firstly, the upper surface of the above transformer is held by the suction nozzle, the surface-mount type switching power-supply unit is transferred to a target mounting area on the mother board by the suction nozzle, and the surface-mount type switching power-supply unit is surface mounted in the mother board. Because it is not required to provide a nozzle suction surface for the suction nozzle's exclusive use, transfer molding is not needed, and accordingly a low-profile and low-cost surface-mount type switching power-supply unit can be facilitated.

8 Claims, 4 Drawing Sheets

SURFACE-MOUNT TYPE SWITCHING POWER-SUPPLY UNIT AND MOUNTING METHOD FOR THE SAME

This application is a Divisional of U.S. patent application Ser. No. 09/829,172 filed Apr. 9, 2001, now abandoned.

BACKGROUND OF THE INVENTION

1. Field of the Invention

The present invention relates to a surface-mount type switching power-supply unit provided with a switching power-supply circuit of an isolation type having a transformer and a mounting method for the same.

2. Description of the Related Art

A surface-mount type switching power-supply unit is designed in modules in such a way that, for example, a switching power-supply circuit made up of an AC-DC converter, a DC—DC converter, an inverter, etc., is constructed by forming a plurality of circuit components, wiring patterns, etc., on a circuit board. Such a switching power-supply unit is surface mounted, for example, on a mother board. When the above switching power-supply unit is surface mounted on the mother board, for example, first of all, the above switching power-supply unit is held by a suction nozzle, the switching power-supply unit is transferred to the mother board by the suction nozzle, and then the switching power-supply unit is surface mounted on the mother board by reflowing welding, etc.

When the switching power-supply unit is transferred by the suction nozzle, in order to prevent problems such as dropping the switching power-supply unit from the suction nozzle, etc., a broad and flat surface for suction by the above suction nozzle is required on the switching power-supply unit. In the prior art, for example, the whole of a switching power-supply unit is covered by a case and transfer molding takes place as shown in FIG. 5. That is, the whole switching power-supply unit is transfer molded and a broad and flat surface for the suction nozzle is secured in the upper portion of the switching power-supply unit.

However, when such a transfer molding takes place, because a case covering all the components of a switching power-supply circuit on the upper side of a switching power-supply unit is provided with a spacing between the case and all the components, a problem of heightening the switching power-supply unit arises, and accordingly, measures to produce low-profile products cannot be fully taken. Moreover, high costs for the transfer molding are needed, and then a problem of increasing the cost of the switching power-supply units also arises.

SUMMARY OF THE INVENTION

Accordingly, it is an object of the present invention to facilitate a low-profile and low-cost surface-mount type switching power-supply unit and provide a mounting method for the same.

In order to attain the above object, the following construction is used in the present invention. According to a first aspect of the present invention, a surface-mount type switching power-supply unit comprises a circuit board, and a switching power-supply circuit including a transformer is provided on the circuit board. A substantially flat nozzle suction surface to be held by a suction nozzle for transferring the surface-mount type switching power-supply unit is provided as an upper portion of the transformer mounted on the circuit board.

In the present invention, the nozzle suction surface of the transformer is nearly parallel to the board surface of the circuit board.

In the present invention, terminals are formed in a transformer so as to protrude, a through-hole portion for placing the transformer is formed in a circuit board and connection pads are formed in the periphery of the through-hole portion, the transformer is placed in the through-hole portion, the terminals are connected to the connection pads, and the transformer is placed and mounted in the circuit board.

In the present invention, the transformer may comprise a coil pattern portion formed in a circuit board and core materials, core-pin insertion through-holes are formed in an area where the coil pattern portion is formed in the circuit board, and the core materials are mounted in the coil pattern of the circuit board by the leg portions of the core materials inserted into the core-pin insertion through-holes.

In the present invention, the upper portion of the core materials is made a flat nozzle suction surface.

In the present invention, a transformer is arranged at the center of gravity of the surface-mount type switching power-supply unit.

In the present invention, components constituting the switching power-supply circuit are exposed without molding resin on the surface of the surface-mount type switching power-supply unit.

In a second aspect of the present invention, a mounting method for a surface-mount type switching power-supply unit in which the upper surface of a transformer is made a flat nozzle suction surface, comprises the steps of applying suction to the flat upper surface of a transformer of the surface-mount type switching power-supply unit by a suction nozzle, transferring the surface-mount type switching power-supply unit to a target mounting area of a mother board by the suction nozzle, and then surface mounting the surface-mount type switching power-supply unit in the mother board.

According to the invention constructed as in the above, the upper portion of a transformer is flattened and the flat upper surface of the transformer is made a suction surface for a suction nozzle. Because of this, when a surface-mount type switching power-supply unit is surface mounted on a mother board, first of all, the flat upper surface of the transformer of a surface-mount type switching power-supply unit is held by the suction nozzle, and the surface-mount type switching power-supply unit is transferred to a target mounting area of the mother board by the suction nozzle. Then, the surface-mount type switching power-supply unit is surface mounted in the mother board.

In this way, because the upper surface of a transformer of a surface-mount type switching power-supply unit is constructed so as to function as a nozzle suction surface, it is not required to form a nozzle suction surface by transfer molding the conventional surface-mount type switching power-supply units. Because of this, the problems resulting from transfer molding, that is, the problems of being too thick and high-cost, can be prevented. In this way, a low-profile and low-cost surface-mount type switching power-supply unit can be facilitated.

Other features and advantages of the present invention will become apparent from the following description of the invention which refers to the accompanying drawings.

BRIEF DESCRIPTION OF THE DRAWING(S)

Figure 3A:
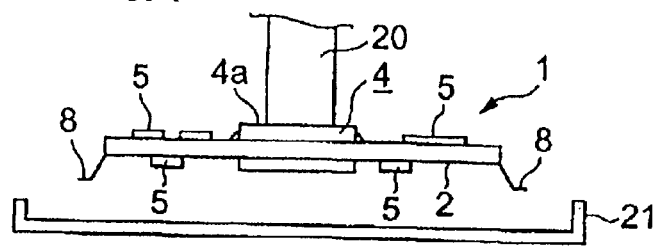
Figure 3B:
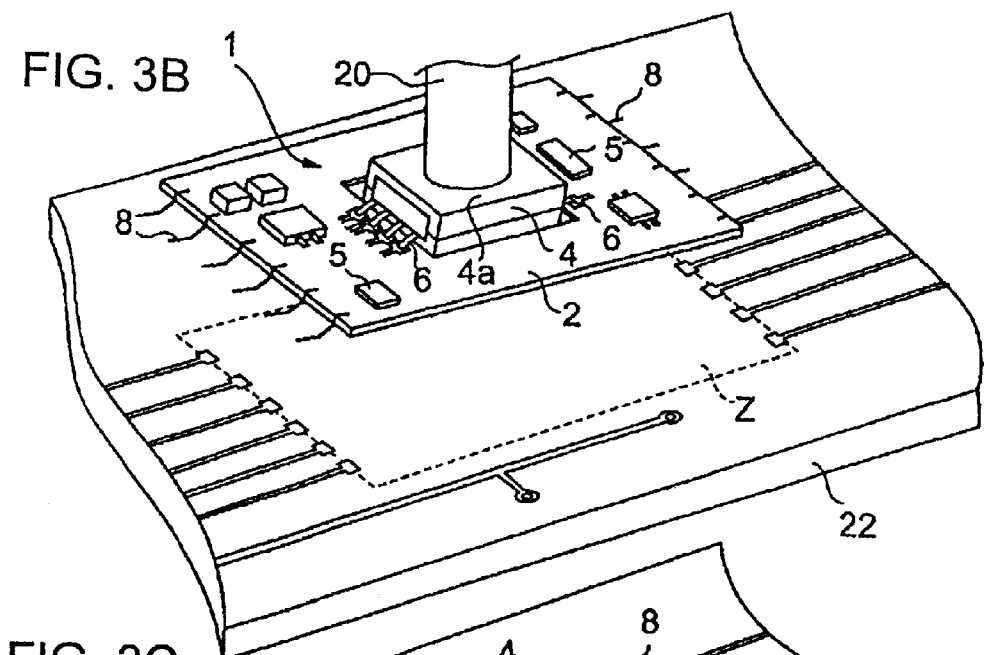
Figure 3C:
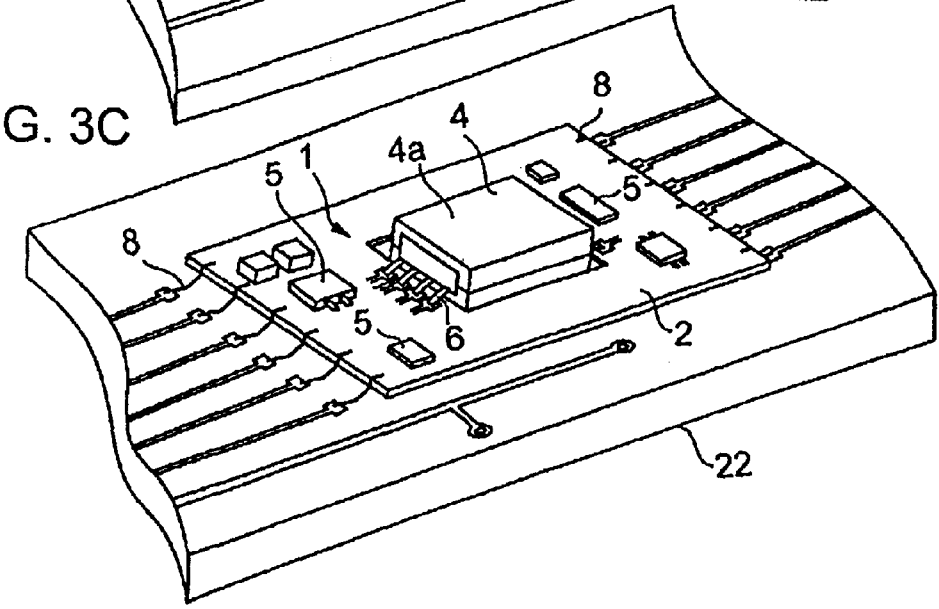
Figure 4:
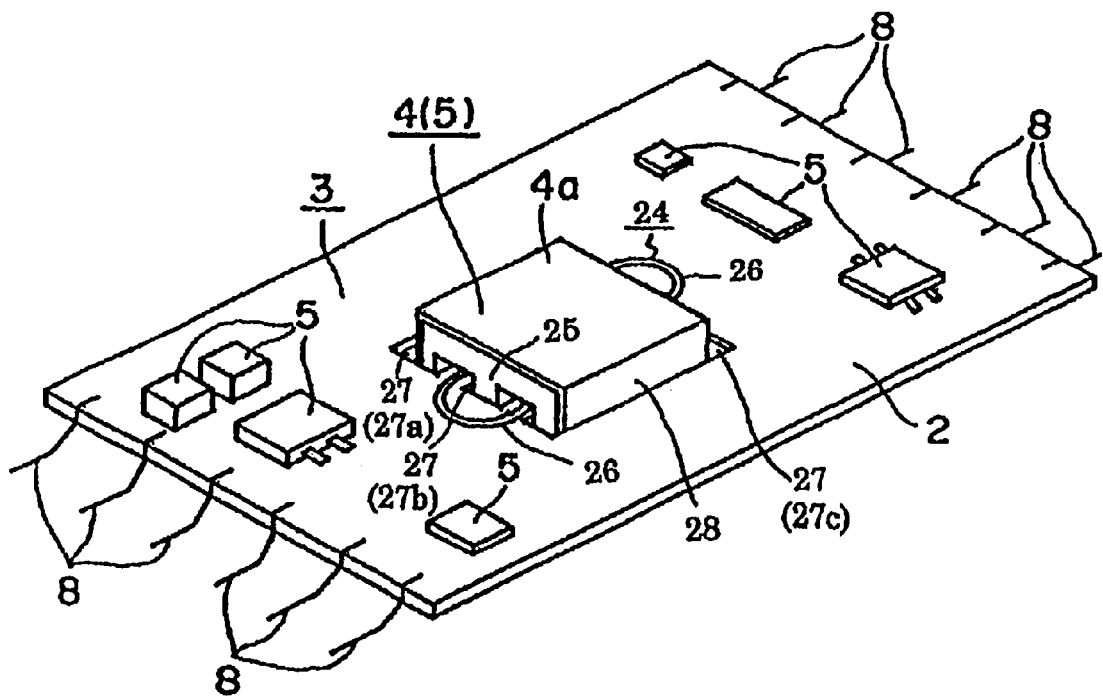
Figure 5:
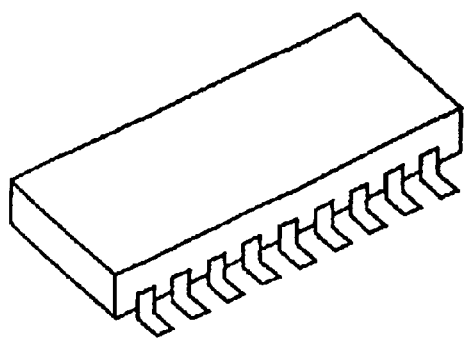

FIGS. 3A, 3B, and 3C are schematic illustrations showing one example of a mounting process for a surface-mount type switching power-supply unit;

FIG. 4 is a schematic perspective view showing a surface-mount type switching power-supply unit of a second embodiment; and FIG. 5 is an illustration of one example of a prior art transfer molded surface-mount type switching power-supply unit.

DETAILED DESCRIPTION OF EMBODIMENTS OF THE INVENTION

Hereinafter, the embodiments according to the present invention are described with reference to the drawings.

Figure 1:
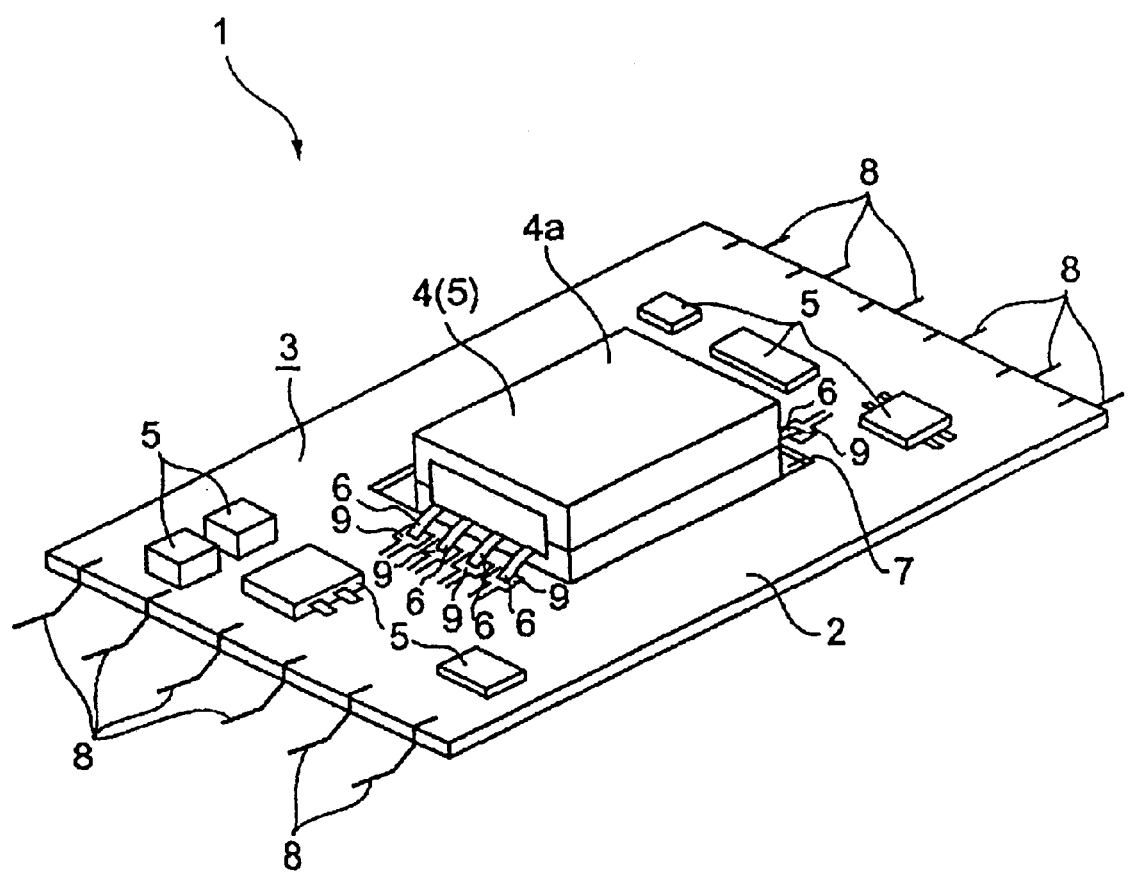
FIG. 1 is a schematic perspective view showing a surface-mount type switching power-supply unit of a first embodiment according to the present invention.

FIG. 1 is a schematic perspective view showing a surface-mount type switching power-supply unit of a first embodiment according to the present invention. In the surface-mount type switching power-supply unit 1 of a first embodiment, a switching power-supply circuit 3 of an isolation type is formed on a circuit board 2. The above switching power-supply circuit 3 is composed of a plurality of circuit components including a transformer 4 and wiring patterns (not illustrated) formed on the circuit board 2. In this first embodiment, the switching power-supply circuit 3 has an appropriate circuit construction corresponding to the specifications for AC-DC converters, DC—DC converters, inverters, etc., and its circuit construction may be of any type if the switching power-supply circuit 3 is of an isolation type having a transformer, and the description is omitted here.

Moreover, among the above-mentioned circuit components 5, except the transformer 4, for example, IC chips, capacitor elements, switching elements and rectifier elements as semiconductor elements, etc., are included. Here, reference numeral 8 in FIG. 1 represents connection pins for connecting the surface-mount type switching power-supply unit 1 to a mother board.

The characteristic of the first embodiment is that a particular construction is provided so that a thin (low-profile) and low-cost surface-mount type switching power-supply unit 1 can be facilitated.

Then, the inventor noticed that if the upper surface of a component constituting the switching power-supply circuit 3 functions as a suction surface for a transferring suction nozzle, it is not required to transfer mold the surface-mount type switching power-supply unit 1, and accordingly a greatly thinner surface-mount type switching power-supply unit 1 can be facilitated.

The inventor has realized that the transformer 4 can be used as a component for suction by the nozzle. Amongst a plurality of circuit components 5 constituting the switching power-supply circuit 3, the transformer 4 is the largest one. When the thickness of the transformer 4 is reduced, it is required to increase the area of the upper surface of the transformer 4 in order to maintain the required characteristics, and the upper surface 4a of the above-mentioned transformer 4 meeting the requirement for thinner products has as large an area as fully functions as the suction surface of a transferring suction nozzle.

In the first embodiment, as described above, because the upper surface 4a of the transformer 4 is used as a nozzle suction surface, it is not needed to mold a surface-mount type switching power-supply unit 1 in order to form a suction nozzle surface as described in the conventional example. Therefore, in the first embodiment, the above surface-mount type switching power-supply unit 1 has a plurality of circuit components 5 including a transformer 4 constituting the above switching power-supply circuit 3 exposed as shown in FIG. 1.

In the first embodiment, the above transformer 4 is composed of a coil wound on a ribbon, and, as shown in FIG. 1, the transformer is thin and becomes flat when it is made thinner. In the transformer 4, as shown in FIG. 1, a plurality of terminals is formed so as to protrude. Furthermore, in the circuit board 2, a through-hole 7 is formed nearly in the middle, and pads (connection pads) 9 for connecting the above terminals 6 are formed in the periphery of the opening of the through-hole 7. The above transformer 4 is placed in the above through-hole 7, and each of the above terminals 6 is connected to the corresponding pad 9, respectively. That is, the above transformer 4 is placed in the circuit board 2 this way and mounted. Because of this, the surface-mount type switching power-supply unit 1 is made much thinner.

Furthermore, in the first embodiment, the above transformer 4 is arranged at the approximate center of gravity of the surface-mount type switching power-supply unit 1. That is, the positional arrangement of a plurality of circuit components 5 excluding the transformer 4 is designed so that the location of the transformer 4 is nearly or at the center of gravity of the switching power-supply unit 1.

In the first embodiment, as described before, the upper surface 4a of the above transformer 4 functions as a nozzle suction surface and is nearly parallel to the surface of the circuit board 2. The upper surface 4a of the transformer 4 has as large an area as functions as a nozzle suction surface to be held by a suction nozzle for transferring a surface-mount type switching power-supply unit. That is, the upper surface 4a of the transformer 4 which functions as a nozzle suction surface has as large an area as covers the whole opening area of the tip of the above suction nozzle without leaving any exposed suction nozzle tip area.

Furthermore, the upper surface 4a of the transformer 4 is formed so as not to leave any uneven surface area, and is formed so as to have a flat surface whereby the entire suction area of the suction nozzle can be applied to the transformer 4 held by the suction nozzle and thereby prevent the transformer 4 from dropping.

Figure 2A:
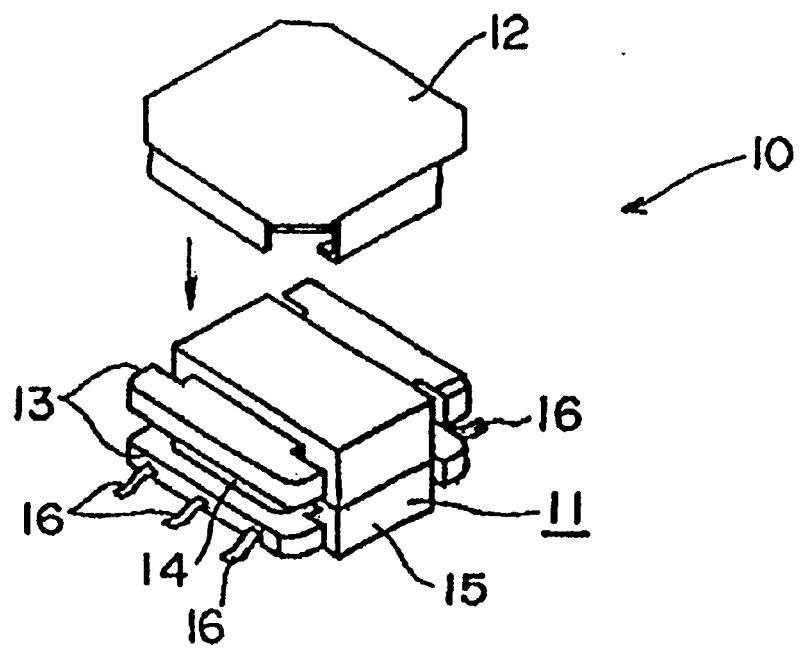
FIGS. 2A and 2B are illustrations showing examples of ways for making the upper portion of a transformer a flat surface.

There are various ways for making the upper surface 4a of the transformer 4 smooth. For example, in Japanese Unexamined Utility Model Application publication No. 4-125429, a surface-mount transformer as in FIG. 2A is shown. According to the present invention, the upper surface of the surface-mount transformer can be made a flat surface by putting a cover 12 having a flat surface on the top of the main body 11 of the transformer, as shown. Moreover, bobbins 13, a coil 14, a core, and terminals are shown in FIG. 2A.

Figure 2B:
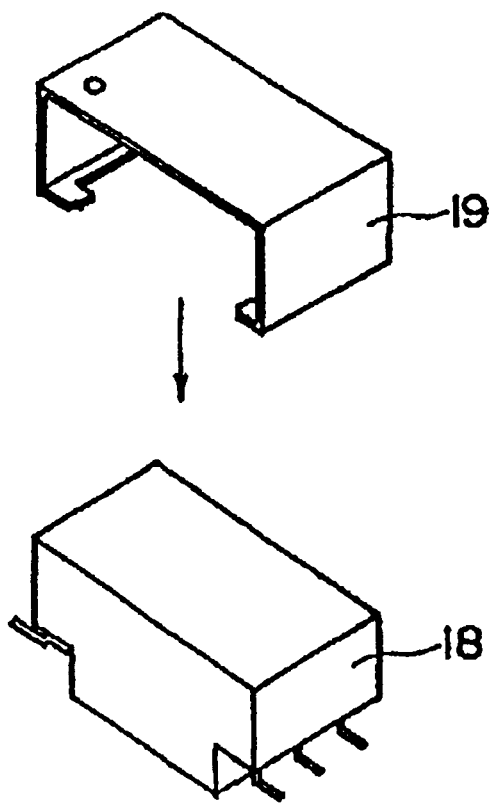

Furthermore, in Japanese Unexamined Utility Model Application publication No. 5-21416, a transformer like that of FIG. 2B is shown. According to the present invention, the upper surface of such a surface-mount transformer 18 as shown in FIG. 2B can be made a flat surface by putting a cover 19 thereon having a flat surface on the surface-mount transformer 18 in the same way as described above.

In this way, various ways for flattening the upper surface of a transformer are proposed, and here in the present invention the upper surface of a transformer may be flattened by any of these methods or devices and it is not limited to any of these flattening methods or devices.

In the first embodiment, as described above, a transformer 4 in which a measure to flatten the upper surface was taken is used.

The surface-mount type switching power-supply unit 1 shown in the first embodiment is constructed as described above. When such a surface-mount type switching power-supply unit 1 is mounted on a mother board, for example, first of all, suction is applied to the upper surface 4a of the transformer 4 of the surface-mount type switching power-supply unit 1 accommodated in a component-accommodating tray 21, etc., by a suction nozzle 20 as shown in FIG. 3A. Then, as shown in FIG. 3B, the above surface-mount type switching power-supply unit 1 is transferred to a target mounting area Z of a mother board 22 shown by a dotted line in FIG. 3B by the suction nozzle 20. In the first embodiment, as described above, the transformer 4 is arranged in the middle area of the surface-mount type switching power-supply unit 1, that is, nearly at the center of gravity of the surface-mount type switching power-supply unit 1, and because suction is applied to the upper surface 4a of the transformer 4 by the suction nozzle, the surface-mount type switching power-supply unit 1 can be transferred under conditions that its weight is well balanced and without allowing excessive play.

Then, the surface-mount type switching power-supply unit 1 is located at a mounting location set in the mother board 22 and the surface-mount type switching power-supply unit 1 is surface mounted by reflowing soldering, etc., as shown in FIG. 3C.

According to the first embodiment, because the upper surface 4a of the transformer 4 is constructed so as to function as a nozzle suction surface, it is not required to form a flat surface for the suction nozzle's exclusive use, and accordingly it is not needed to transfer mold the surface-mount type switching power-supply unit 1, that is, molding resin on the surface of the surface-mount type switching power-supply unit 1 is not necessary. Because of this, a thin (low-profile) surface-mount type switching power-supply unit 1 can be easily facilitated.

Furthermore, as described above, transfer molding is not required and the cost of transfer molding can be eliminated, and, as a result, an inexpensive surface-mount type switching power-supply unit 1 can be provided.

Moreover, in the first embodiment, because the upper-surface 4a of the transformer 4 is flattened, the upper surface of the above transformer 4 can be securely held by the suction nozzle. In addition, in the first embodiment, because the transformer is arranged in the middle area of the circuit board 2 (location of the center of gravity), when the surface-mount type switching power-supply unit 1 is transferred by suction applied to the upper surface 4a of the transformer 4 by the suction nozzle, the surface-mount type switching power-supply unit 1 can be transferred under conditions that its weight is well balanced. Because of this, problems such as dropping, etc., can be prevented and the surface-mount type switching power-supply unit 1 can be transferred to the mother board reliably.

Hereinafter, a second embodiment is described. In this second embodiment, a transformer using coil windings is not mounted, but a transformer in a particular shape as shown in FIG. 4 is mounted. The construction excluding that is nearly the same as the first embodiment, and in the second embodiment the same portions as in the first embodiment are provided the same reference numerals and it is unnecessary to provide a description of common portions twice.

In the second embodiment, the transformer 4 comprises a coil pattern portion 24 formed in a circuit board 2 and a pair of core materials 25. The circuit board 2 is a laminated body in which a plurality of boards are laminated, and, for example, the above coil pattern portion 24 comprising coil patterns 26 which are formed on each of the plurality of boards constituting the above circuit board 2. That is, coil patterns which function as a primary coil and coil patterns which functions as a secondary coil are formed on the boards constituting the above circuit board 2, and the above coil pattern portion 24 comprises the pluralities of coil patterns arranged so that the center of each of the coil patterns comes to a common axis in the lamination direction.

As is shown in FIG. 4, core-pin insertion through-holes 27 (27a, 27b, and 27c) are formed in an area where the above coil pattern portion 24 is formed in the circuit board 2. The core pins (leg portions) of the above core materials 25 are inserted into the above core-pin insertion through-holes 27, the pair of core materials 25 are combined, and they are mounted in the coil pattern portion 24. As is shown in FIG. 4, the pair of core materials 25 are attached to the above coil pattern portion 24 in such a way that part of the above coil pattern portion 24 is sandwiched between both the surface and back sides of the circuit board 2.

In the second embodiment, the above pair of core materials 25 are combined by being set in a core assembly member 28. The upper surface of the core assembly member 28 is made the upper surface 4a of the transformer 4, and the upper surface of the core assembly member 28 is nearly parallel to the board surface of the circuit board 2 and is a flat surface. Because the surface of the core materials 25 is rough, the surface of the core materials 25 is difficult to function as a nozzle suction surface as it is, but by covering the upper surface of the above core materials 25 by the core assembly member 28 and by the core assembly member 28 constituting the upper surface of the transformer a smooth nozzle suction surface can be obtained, and accordingly the upper portion of the core materials 25 can be made to function as a nozzle suction surface.

According to the second embodiment, in the same way as the first embodiment, because the upper surface 4a of the transformer 4 is constructed so as to function as a suction surface of the suction nozzle, it is not required to transfer mold the surface-mount type switching power-supply unit 1 differently from the conventional ones, and accordingly a low-profile and low-cost surface-mount type switching power-supply unit 1 can be easily achieved to the degree where transfer molding is not required.

Furthermore, because the upper surface 4a of the transformer 4 is flattened, the upper surface 4a of the transformer 4 can be securely held by the suction nozzle. In addition, because the transformer 4 is preferably arranged substantially in the middle area (location of the center of gravity) of the surface-mount type switching power-supply unit 1, the surface-mount type switching power-supply unit 1 can be transferred by the suction nozzle under conditions that its weight is well balanced, and problems of dropping during its transfer, etc., can be prevented.

Moreover, the present invention is not limited to the above embodiments, and various embodiments can be adopted. For example, in each of the above embodiments, the upper surface 4a of the transformer 4 was made a flat surface by making use of the upper flat surface of the covers 12 and 19 and the core assembly member 28, but, for example, by winding a tape for fixing the core on the transformer 4, the upper surface of the transformer 4 may be made flat.

Furthermore, in each of the above embodiments, the surface-mount type switching power-supply unit 1 was surface mounted by making connection pins 8 in contact with a mother board 22, but for example, in a surface-mount type switching power-supply unit in which parts and winding patterns are not formed on the back side of the circuit board 2, the surface-mount type switching power-supply unit 1 may be surface mounted on the mother board 22 by directly connecting the back side of the circuit board 2 to the mother board 22 by soldering, etc. In this way, the surface-mount type switching power-supply unit 1 can be surface mounted on the mother board 22 in various ways, and here any of these may be used and the method of surface mounting is not particularly limited.

Moreover, in the above second embodiment, a pair of core materials were assembled by using a core assembly member 28, but, for example, a pair of core materials 25 may be combined by making use of adhesive, etc., without using the core assembly member 28. In this way, when the core assembly member is not utilized, for example, a tape is provided on the upper surface of the core materials 25 and the upper surface 4a of the transformer 4 may be formed as a flat nozzle surface by the tape.

According to a surface-mount type switching power-supply unit of the present invention, because the upper portion of a transformer is made a flat nozzle suction surface, it is not required to mold resin on the surface of a surface-mount type switching power-supply unit or transfer mold a surface-mount type switching power-supply unit in order to form a nozzle suction surface as in conventional ones. That is, while components constituting a switching power-supply circuit are exposed, it becomes possible to transfer the surface-mount type switching power-supply unit by the suction nozzle.

In that way, because a surface-mount type switching power-supply unit is not transfer molded, a low-profile surface-mount type switching power-supply unit can be achieved. In addition, as described above, because the surface-mount type switching power-supply unit is not transfer molded, the cost can be reduced and an inexpensive surface-mount type switching power-supply unit can be provided.

In the case where the nozzle suction surface of a transformer is parallel to the board surface of a circuit board, when the nozzle suction surface of the above transformer is held by a suction nozzle and the surface-mount type switching power-supply unit is transferred, the above surface-mount type switching power-supply unit can be transferred to a fixed mounting area under conditions that the surface-mount type switching power-supply unit is reliably held by the suction nozzle.

In the construction where a transformer is placed and mounted in a circuit board, the height of the transformer can be controlled, and accordingly a low-profile surface-mount type switching power-supply unit can be achieved.

In the construction where a transformer is composed of a coil pattern portion formed in a circuit board and core materials and the upper portion of the core materials of the transformer is made a flat nozzle suction surface, the transformer is very thin and because the transformer is an inexpensive component due to its simplified manufacturing processes, a low-profile and low-cost surface-mount type switching power-supply unit can be achieved to a much more advanced level.

In the construction where a transformer is arranged at the approximate center of gravity of a surface-mount type switching power-supply unit, when the switching power-supply unit is transferred by a suction nozzle, the surface-mount type switching power-supply unit can be transferred under conditions that its weight is well balanced and without excessive play. Because of this, the problem of dropping of the surface-mount type switching power-supply unit while it is being transferred, etc., can be controlled.

Moreover, in the invention of a mounting method where the flat surface of the transformer is held by a suction nozzle, a surface-mount type switching power-supply unit is transferred to its target mounting area of a mother board by the suction nozzle, and the surface-mount type switching power-supply unit is surface mounted on the mother board, as described above, because a surface-mount type switching power-supply unit is transferred by a suction nozzle holding the upper surface of the transformer of the surface-mount type switching power-supply unit, it is not required to form a nozzle suction surface for the suction nozzle's exclusive use, and, as described above, transfer molding is not needed differently from the conventional ones, and accordingly it is easy to facilitate a low-profile and low-cost surface-mount type switching power-supply unit.

While the invention has been particularly shown and described with reference to preferred embodiments, it will be understood by those skilled in the art that the foregoing and other changes in form and details can be made without departing from the spirit and scope of the invention.

Although the present invention has been described in relation to particular embodiments thereof, many other variations and modifications and other uses will become apparent to those skilled in the art. Therefore, the present invention should be limited not by the specific disclosure herein, but only by the appended claims.

What is claimed is:

1. A surface-mount type switching power-supply unit comprising:
   a circuit board; and
   a switching power-supply circuit including a transformer mounted on the circuit board; wherein
   a substantially flat nozzle suction surface to be held by a suction nozzle for transferring the surface-mount type switching power-supply unit is provided as an upper portion of the transformer mounted on the circuit board;
   the transformer comprises a coil pattern portion provided in or on the circuit board and core materials, core-pin insertion through-holes are provided in an area of the circuit board where the coil pattern portion is provided in or on the circuit board, and the core materials are mounted adjacent the coil pattern portion of the circuit board by leg portions of the core materials inserted into the core-pin insertion through-holes; and
   the transformer is arranged at the approximate center of gravity of the surface-mount type switching power-supply unit.

2. The surface-mount type switching power-supply unit as claimed in claim 1, wherein the nozzle suction surface of the transformer is nearly parallel to a board surface of the circuit board.

3. The surface-mount type switching power-supply unit as claimed in claim 2, wherein components comprising the switching power-supply circuit board are exposed without molding resin on a surface of the surface-mount type switching power-supply unit.

4. The surface-mount type switching power-supply unit as claimed in claim 1, wherein the upper portion of the core materials comprises the flat nozzle suction surface.

5. The surface-mount type switching power-supply unit as claimed in claim 4, wherein components comprising the switching power-supply circuit board are exposed without molding resin on a surface of the surface-mount type switching power-supply unit.

6. The surface-mount type switching power-supply unit as claimed in claim 1, wherein components comprising the switching power-supply circuit board are exposed without molding resin on a surface of the surface-mount type switching power-supply unit.

7. A surface-mount type switching power-supply unit comprising:

a circuit board; and a switching power-supply circuit including a transformer mounted on the circuit board; wherein a substantially flat nozzle suction surface to be held by a suction nozzle for transferring the surface-mount type switching power-supply unit is provided as an upper portion of the transformer mounted on the circuit board;

the nozzle suction surface of the transformer is substantially parallel to a board surface of the circuit board;

the transformer comprises a coil pattern portion provided in or on the circuit board and core materials, core-pin insertion through-holes are provided in an area of the circuit board where the coil pattern portion is provided in or on the circuit board, and the core materials are mounted adjacent the coil pattern portion of the circuit board by leg portions of the core materials inserted into the core-pin insertion through-holes;

an upper portion of the core materials defines the flat nozzle suction surface;

the transformer is arranged at the approximate center of gravity of the surface-mount type switching power-supply unit; and components defining the switching power-supply circuit are exposed without molding resin on a surface of the surface-mount type switching power-supply unit.

8. A mounting method for a surface-mount type switching power-supply unit in which an upper surface of a transformer comprises a substantially flat nozzle suction surface, comprising the steps of:

mounting the transformer at a location on a circuit board of the surface-mount type switching power supply unit so that the transformer is at approximately the center of gravity of the surface-mount type switching power-supply unit;

applying suction to the upper surface of the transformer of the surface-mount type switching power-supply unit with a suction nozzle;

transferring the surface-mount type switching power-supply unit to a target mounting area of a mother board by the suction nozzle;

surface mounting the surface-mount type switching power-supply unit to the mother board; wherein the transformer comprises a coil pattern portion provided in or on the circuit board and core materials, core-pin insertion through-holes are provided in an area of the circuit board where the coil pattern portion is provided in or on the circuit board, such that in the step of surface mounting the core materials are mounted adjacent the coil pattern portion of the circuit board by leg portions of the core materials inserted into the core-pin insertion through-holes; and components defining the switching power-supply circuit are exposed without molding resin on a surface of the surface-mount type switching power-supply unit.

* * * * *